(12) United States Patent
Divakaruni et al.

(10) Patent No.: US 6,541,810 B2
(45) Date of Patent: Apr. 1, 2003

(54) MODIFIED VERTICAL MOSFET AND METHODS OF FORMATION THEREOF

(75) Inventors: Ramachandra Divakaruni, Somers, NY (US); Prakash Dev, Plano, TX (US); Rajeev Malik, Pleasantville, NY (US); Larry Nesbit, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/896,741

(22) Filed: Jun. 29, 2001

(65) Prior Publication Data

US 2003/0001200 A1 Jan. 2, 2003

(51) Int. Cl.[7] .............................................. H01L 27/108
(52) U.S. Cl. ........................ 257/302; 257/301; 257/304; 257/305
(58) Field of Search ................................ 257/301, 302, 257/304, 305; 438/243, 386

(56) References Cited

U.S. PATENT DOCUMENTS

| | | | | |
|---|---|---|---|---|
| 4,890,145 A | * | 12/1989 | Malhi | 257/302 |
| 5,198,383 A | * | 3/1993 | Teng et al. | 438/246 |
| 5,827,765 A | | 10/1998 | Stengl et al. | 438/243 |
| 5,831,301 A | * | 11/1998 | Horak et al. | 257/302 |
| 5,981,332 A | | 11/1999 | Mandelman et al. | 438/246 |
| 6,074,909 A | * | 6/2000 | Gruening | 438/242 |
| 6,177,698 B1 | * | 1/2001 | Gruening et al. | 257/302 |
| 6,184,107 B1 | * | 2/2001 | Divakaruni et al. | 438/427 |
| 6,190,971 B1 | * | 2/2001 | Gruening et al. | 438/270 |
| 6,225,158 B1 | * | 5/2001 | Furukawa et al. | 438/243 |
| 6,399,447 B1 | * | 6/2001 | Clevenger et al. | 438/268 |
| 6,333,533 B1 | * | 12/2001 | Furukawa et al. | 257/301 |
| 6,423,594 B1 | * | 7/2002 | Tsai et al. | 438/243 |
| 6,448,610 B2 | * | 9/2002 | Weis | 257/330 |

* cited by examiner

*Primary Examiner*—George Eckert
(74) *Attorney, Agent, or Firm*—Steven Capella; Cantor Colburn LLP

(57) ABSTRACT

The vertical MOSFET structure used in forming dynamic random access memory comprises a gate stack structure comprising one or more silicon nitride spacers; a vertical gate polysilicon region disposed in an array trench, wherein the vertical gate polysilicon region comprises one or more silicon nitride spacers; a bitline diffusion region; a shallow trench isolation region bordering the array trench; and wherein the gate stack structure is disposed on the vertical gate polysilicon region such that the silicon nitride spacers of the gate stack structure and vertical gate polysilicon region form a borderless contact with both the bitline diffusion region and shallow trench isolation region. The vertical gate polysilicon is isolated from both the bitline diffusion and shallow trench isolation region by the nitride spacer, which provides reduced bitline capacitance and reduced incidence of bitline diffusion to vertical gate shorts.

6 Claims, 4 Drawing Sheets

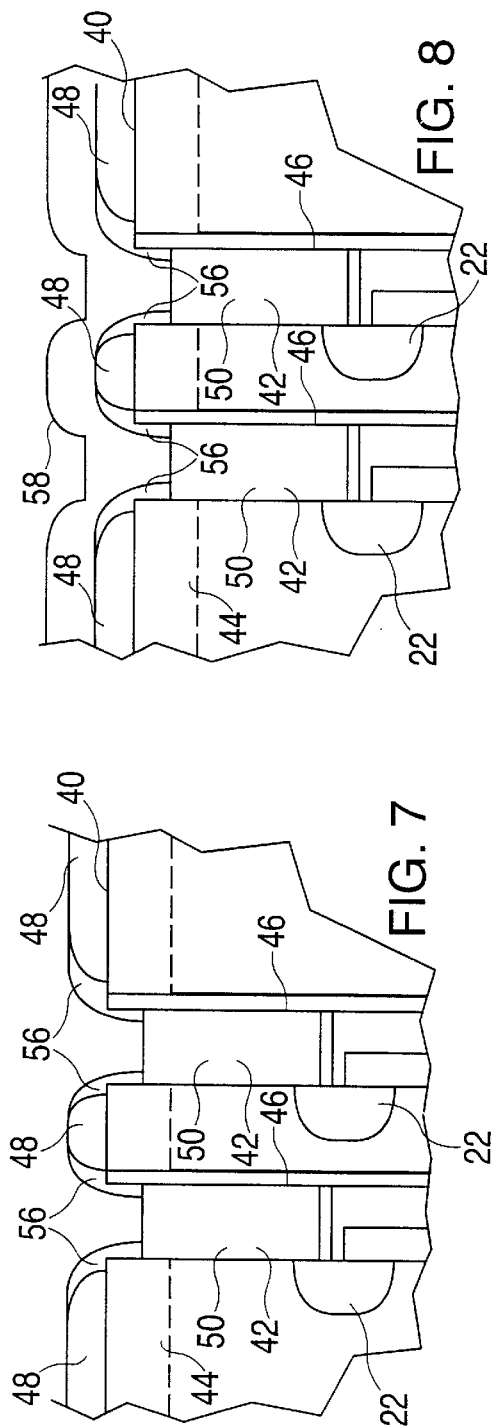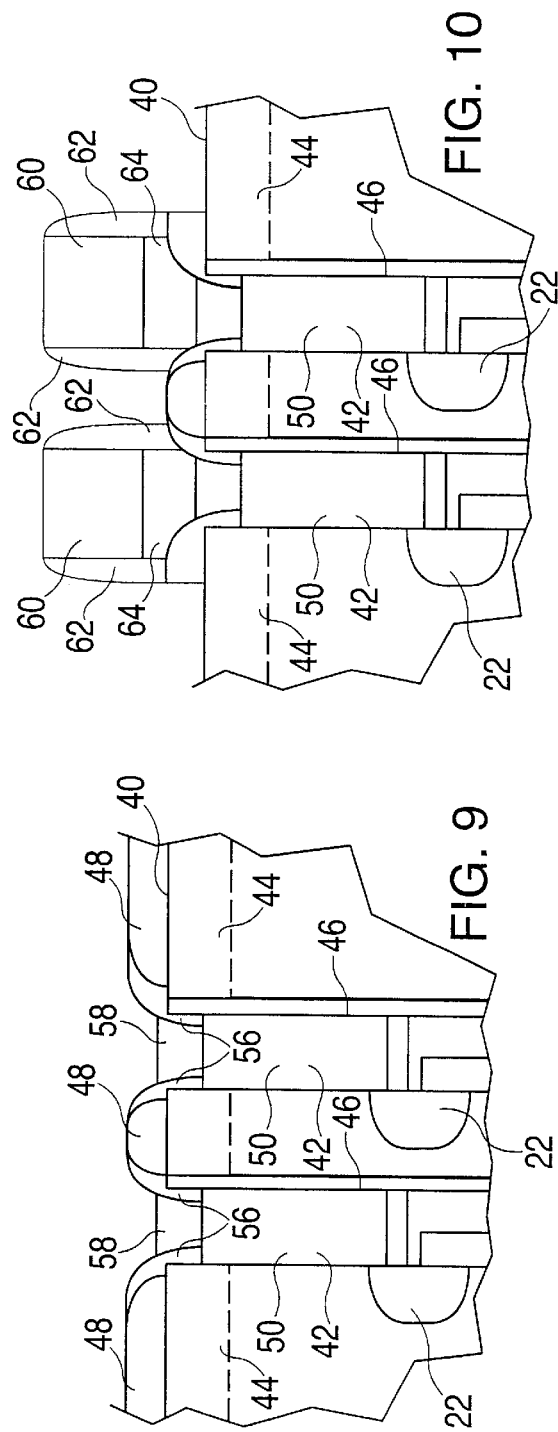

MODIFIED VERTICAL MOSFET AND METHODS OF FORMATION THEREOF

BACKGROUND OF THE INVENTION

The present invention relates to processes for the fabrication of integrated circuit devices on semiconductor substrates, and in particular to processes by which self-aligned spacers in vertical gate DRAMs are formed.

A DRAM (dynamic random access memory) circuit usually includes an array of memory cells interconnected by rows and columns, which are known as wordlines (WLs) and bitlines (BLs), respectively. Reading data from or writing data to memory cells is achieved by activating selected wordlines and bitlines. Typically, a DRAM memory cell comprises a MOSFET (metal oxide semiconductor field effect transistor) connected to a capacitor. The transistor includes gate and diffusion regions which are referred to as either drain or source regions, depending on the operation of the transistor.

There are different types of MOSFETs. A planar MOSFET is a transistor where a surface of the channel region of the transistor is generally parallel to the primary surface of the substrate. A vertical MOSFET is a transistor where a surface of the channel region of the transistor is generally perpendicular to the primary surface of the substrate.

Trench capacitors are also frequently used with DRAM cells. A trench capacitor is a three-dimensional structure formed into a silicon substrate. This is normally formed by etching trenches of various dimensions into the silicon substrate. Trenches commonly have N+ doped polysilicon as one plate of the capacitor (a storage node). The other plate of the capacitor is formed usually by diffusing N+ dopants out from a dopant source into a portion of the substrate surrounding the lower part of the trench. Between these two plates, a dielectric layer is placed which thereby forms the capacitor.

To prevent carriers from traveling through the substrate between the adjacent devices, device isolation regions are formed between adjacent semiconductor devices. Generally, device isolation regions take the form of thick oxide regions extending below the surface of the semiconductor substrate. A sharply defined trench is formed in the semiconductor substrate by, for example, anisotropic etching. The trench is filled with oxide back to the surface of the substrate to provide a device isolation region. Trench isolation regions thus formed are called shallow trench isolation (STI) and have the advantages of providing device isolation regions across their entire lateral extent and of providing a more planar structure.

DRAM technology beyond the one hundred nanometer technology node requires the use of vertical MOSFETs to overcome the scalability limitations of planar MOSFET DRAM access transistors. Vertical MOSFETs allow the bit densities required for effective size reduction. However, the use of vertical MOSFETs is not yet widespread and several characteristics need to be optimized.

For example, as a result of increased gate conductor to bitline diffusion overlap area, total bitline capacitance may be larger with vertical MOSFETs than with conventional planar MOSFET structures. FIG. 1 is a cross-sectional view of a vertical MOSFET in which the vertical gate conductor 10 overlaps the entire depth of the bitline diffusion 20. Thus, MOSFET structure 10 includes trench top oxide layer 12, vertical gate polysilicon 14, gate conductor 16, gate nitride cap 18, bitline diffusion 20, storage node diffusion 22, and diffusion stud 24. The large overlap 26 of the vertical gate polysilicon 14 over the entire depth of the bitline diffusion 20 contributes to a larger total bitline capacitance with this vertical MOSFET than with a conventional planar MOSFET. Prior attempts to address this generally require that the depth of the bitline diffusion be minimized. However, minimization of bitline diffusion depth is complicated by the fact that integration requirements may dictate a relatively high thermal budget (i.e., bitline diffusion (BL) needing to be performed relatively early in the process).

An additional drawback of vertical MOSFETs is the occurrence of wordline to bitline diffusion shorts, also referred to as WL-BL shorts. The reason for increased wordline to bitline shorts is because the gate conductor 16 is connected to the vertical gate polysilicon 14 in the trench. This is illustrated in FIG. 2, where a prior art vertical MOSFET structure is shown with a misalignment between the edge of the gate conductor 16 and the edge of the deep trench. The misalignment causes the occurrence of WL-BL shorts, as indicated at 15. To prevent WL-BL shorts, the formation of spacers inside of the deep trench has been proposed in U.S. patent application Ser. No. 09/757,514 and U.S. patent application Ser. No. 09/790,011, both commonly assigned to the assignee. However, the present invention teaches the structure and method to form these spacers after formation of the STI and in a manner that reduces cost as compared to the methods of the previous art.

SUMMARY OF THE INVENTION

A method for forming a semiconductor memory cell array structure comprises providing a vertical MOSFET DRAM cell structure having a deposited polysilicon layer planarized to a top surface of a trench top oxide in an array trench of a silicon substrate; forming a shallow trench isolation oxide region along the array trench; etching the polysilicon layer selective to a nitride layer on the silicon substrate to form one or more silicon nitride spacers between a bitline diffusion region and a vertical gate polysilicon region, and between the shallow trench isolation oxide region and vertical gate polysilicon region; and depositing a gate stack structure over the vertical gate polysilicon region and between one or more silicon nitride spacers to form a borderless contact between the gate stack structure and bitline diffusion region, and shallow trench isolation oxide region. This invention is different from the earlier inventions disclosed in both U.S. patent application Ser. No. 09/757,514 and U.S. patent application Ser. No. 09/790,011, in the fact that the vertical gate polysilicon is not only isolated from the bitline diffusion by the nitride spacer, but also from the isolation oxide by the nitride spacer since the nitride spacer is formed after the shallow trench isolation (STI). This additional feature prevents electrical shorting of the vertical gate polysilicon from the direction of the isolation oxide.

A vertical MOSFET structure used in forming dynamic random access memory comprises a gate stack structure comprising one or more silicon nitride spacers; a vertical gate polysilicon region disposed in an array trench, wherein the vertical gate polysilicon region comprises one or more silicon nitride spacers; a bitline diffusion region; a shallow trench isolation region bordering the array trench; and wherein the gate stack structure is disposed on the vertical gate polysilicon region such that the silicon nitride spacers of the gate stack structure and vertical gate polysilicon region form a borderless contact with the bitline diffusion region and shallow trench isolation region.

The vertical MOSFET formed by this method features reduced vertical gate to top diffusion overlap capacitance (reduced bitline capacitance), and reduced incidence of bitline diffusion to vertical gate shorts (reduced incidence of WL-BL shorts).

The above described and other features are exemplified by the following figures and detailed description.

BRIEF DESCRIPTION OF THE DRAWINGS

FIGS. 3–10 are cross-sectional views illustrating the process steps for the formation a deep trench spacer in a vertical gate region after the formation of the STI;

DETAILED DESCRIPTION OF PREFERRED EMBODIMENTS

FIGS. 3–10 illustrate the method for manufacturing any type of vertical MOSFET structure for a vertical pass gate DRAM arrays. To eliminate and/or reduce the likelihood of WL-BL shorts occurring in vertical pass gate DRAM arrays, a silicon nitride spacer is added in the vertical gate poly region to provide an insulating layer between the gate conductor stud polysilicon and bitline diffusion. The silicon nitride spacers reduce the overlap capacitance between the array wordline and bitline diffusion junction, and create a borderless contact between the vertical MOSFET and bitline diffusion.

Figure 2:
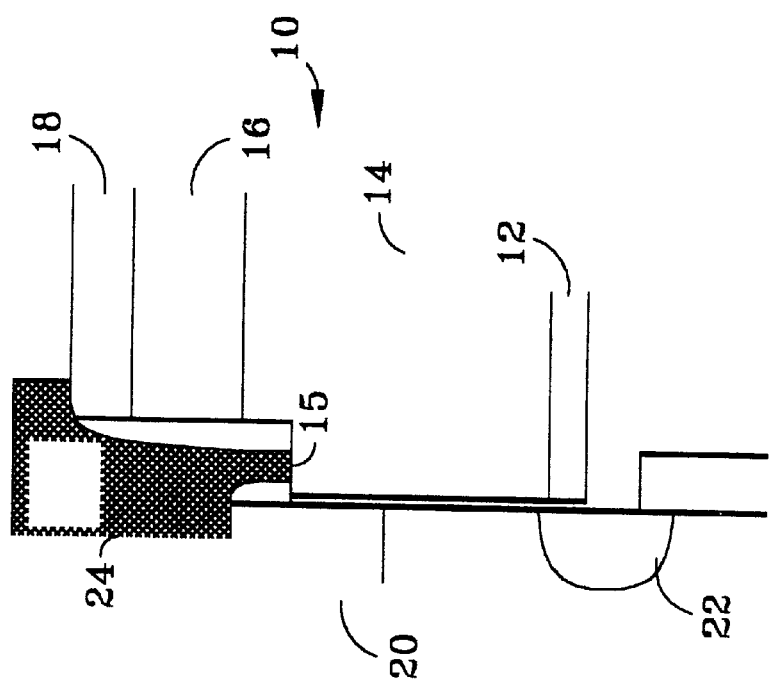
FIGS. 1–2 illustrate cross-sectional views of prior art embodiments of vertical MOSFET structures.
Figure 1:
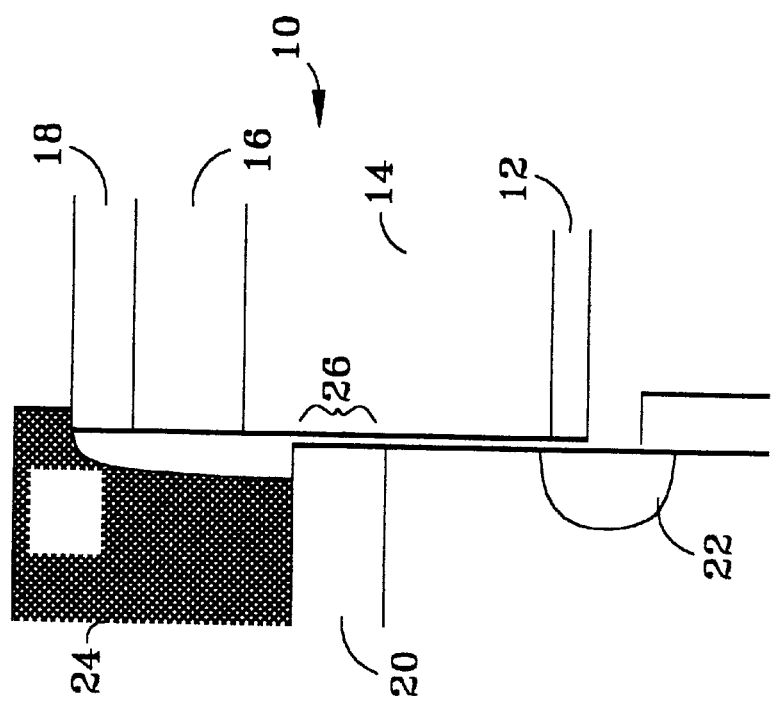
Figure 3:
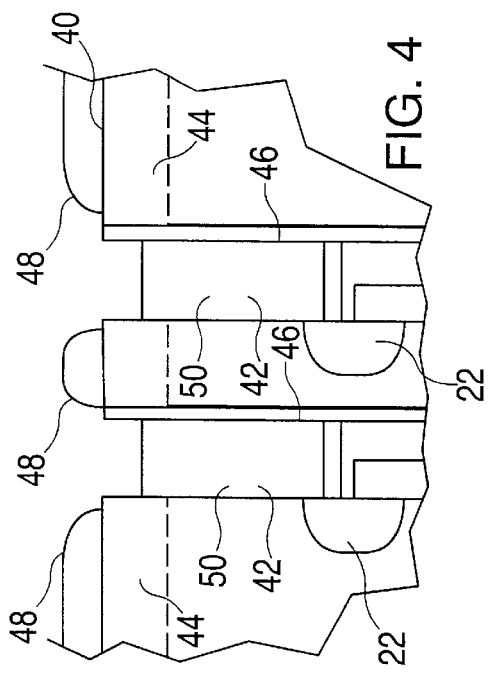

Referring now to a cross-sectional view of a silicon substrate shown in FIG. 3, a silicon substrate, having undergone deep trench, buried strap, vertical gate and active area processing using one or more known methods, or a combination thereof, comprises a silicon substrate surface 40 comprising one or more vertical gate regions 42, a bitline diffusion region 44, an optional oxide collar 46, a layer of array top oxide 48, and a layer of silicon nitride (not shown) disposed on the silicon substrate surface 40. The deposited polysilicon can be doped in situ, or the silicon substrate and deposited polysilicon can be doped one or more times using one or more known doping techniques such as diffusion processes, ion implantation processes, combinations comprising at least one of the foregoing doping techniques, and the like. For purposes of illustration, the vertical gate polysilicon regions 42 forms an N-Field Effect Transistor (N-FET), within a P-type silicon substrate. It is to be noted that the structure of FIG. 3 may be arrived at by many methods known in the art including, but not limited to, the above-mentioned methods. It is also to be noted that FIGS. 3–10 only show the vertical transistor of a more complete structure, which might include a deep trench capacitor connected to the bottom part of the vertical transistor, or a buried bitline (or other known type of conductor), which is connected to the bottom part of the vertical transistor.

Figure 4:
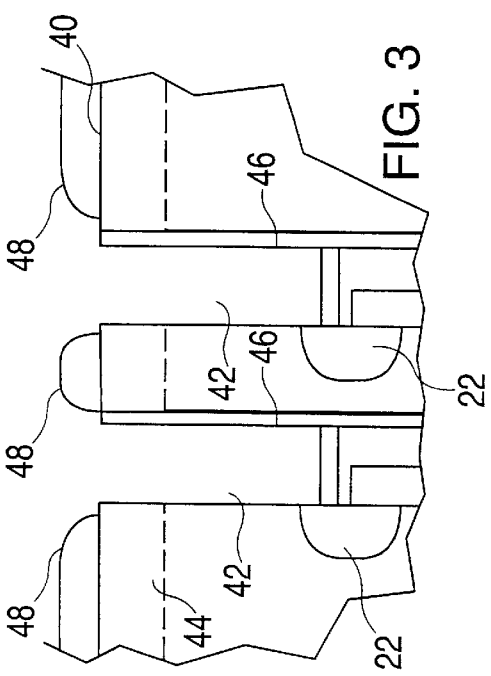

Referring now to FIG. 4, the vertical gate regions 42 are filled with polysilicon 50, preferably N+ doped polysilicon, and recessed using a poly recess technique known in the art that is selective to the trench top oxide 48 and the oxide of the STI region (not shown). The deposited polysilicon 50 is recessed below the silicon surface 40 by preferably about 10 nanometer to about 100 nanometers, more preferably about 50 nanometers below the silicon substrate. N+ doped polysilicon can be deposited using an in situ chemical vapor deposition techniques ("CVD") such as low pressure CVD ("LPCVD"), combinations comprising at least one of the foregoing CVD techniques, and the like. In the alternative, intrinsic polysilicon can also be deposited by CVD techniques, and subsequently doped to form N+ doped polysilicon within the vertical gate region 42.

Figure 5:
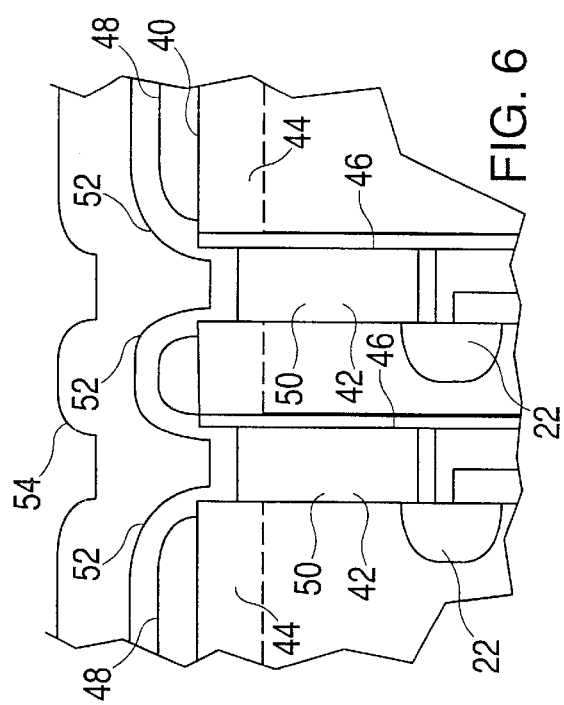

Referring now to FIG. 5, the silicon substrate is further processed using either LPCVD or plasma-enhanced CVD ("PECVD") techniques, as well as combinations comprising at least one of the foregoing techniques, and the like, to form a layer of silicon nitride 52 comprising a thickness of preferably about 5 nanometers to about 100 nanometers. The silicon nitride layer 52 is disposed over the trench top oxide layer 48, exposed sidewalls of the vertical gate region 42, and the vertical gate polysilicon 50. The silicon nitride layer 52 is then removed from the periphery or support areas (not shown), i.e., non-array regions, by a masking method, and a sacrificial layer of silicon oxide (not shown) is grown over the support areas. It is to be noted that prior to growing the sacrificial support oxide, the array top oxide 48 is removed in the support areas by known methods such as wet etching in hydrogen fluoride based chemistries. The support sacrificial oxide is thermally grown from the exposed silicon substrate 40 in the support regions. The silicon nitride 52 in the array region protects the vertical gate polysilicon 50 from being oxidized. The support implants (not shown) are formed, sacrificial oxide stripped, support gate oxide grown, and a layer of gate polysilicon 54 is deposited. The resulting array region is shown in FIG. 6.

Figure 6:
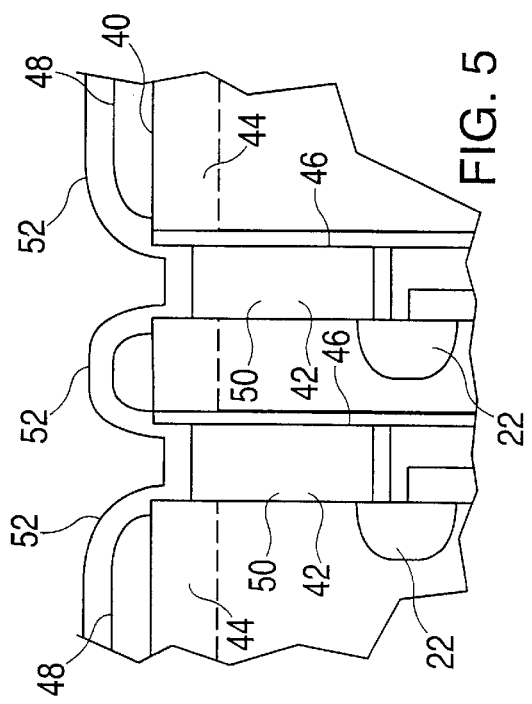

Referring now to FIGS. 6–7, the support polysilicon 54 is masked and etched in the array using a resist mask and etch process. The resist is patterned such that the polysilicon 54 is exposed in the array region, but is covered in the support regions. This allows for the polysilicon 54 to be removed by a chemical downstream etching technique ("CDE") that isotropically removes the polysilicon 54 in the array selective to the underlying nitride layer 52. The nitride layer 52 is then etched anisotropically using known methods such as reactive ion etching ("RIE") to form silicon nitride spacers 56 as shown in FIG. 7. The resist material is then stripped from the entire silicon wafer surface. In the alternative, after the silicon nitride layer 52 is etched forming the spacer, additional spacers may be formed. Once the silicon nitride spacers 56 are formed, the gate conductor can be formed according to methods known in the art. The gate conductor fills the space between the spacers 56 in the array trenches.

The photoresist material can be stripped away using a stripping method or a combination of stripping methods. When stripping photoresist material from a surface such as silicon, examples of possible resist stripping methods can comprise wet chemical stripping methods (such as phenolic organic strippers, solvent/amine strippers, specialty wet strippers), dry stripping, and the like.

Referring now to an alternative embodiment in FIGS. 8–10, a layer of polysilicon 58, or preferably N+ doped polysilicon 58, comprising a thickness of preferably about 1000 angstroms to about 2000 angstroms, more preferably about 1200 angstroms, is deposited over the silicon substrate illustrated in FIG. 8. The deposited polysilicon layer 58 is then blanket recessed to planarize the deposited polysilicon layer 58 with the array top oxide layer 48 (See FIG. 9).

Referring now to FIG. 10, the rest of the gate stack is deposited using methods known in the art. The gate stack structures comprise a gate 64 preferably comprising tungsten, tungsten nitride, tungsten silicide, combinations comprising at least one of the foregoing materials, and the like, and a gate nitride cap 60. The gate stack structure is patterned before one or more silicon nitride spacers 62 are formed using LPCVD techniques, PECVD techniques, nitridation techniques, combinations comprising at least one of the foregoing techniques, and the like. More particularly, a silicon nitride spacer 62 is formed along each sidewall of the gate stack structure. The array top oxide layer 48 is etched selectively to nitride, i.e., silicon nitride spacers 62, until exposing the silicon substrate surface 40. The resulting silicon nitride spacers 62 contact the silicon nitride spacers 56 which creates an insulating layer between the gate stack structure and bitline diffusion region 44, allowing for the subsequent bitline contact to be borderless to the array vertical gate polysilicon 50.

As referenced earlier, beginning with the silicon substrate illustrated in FIG. 7, a gate 64 as described above can be formed between the silicon nitride spacers 56 on the vertical gate polysilicon regions 42 using known methods such as CVD techniques, to deposit the gate conductor 64 conformally, until filling the vertical gate polysilicon regions 42 between the silicon nitride spacers 56. The gate nitride cap 60 is then formed using LPCVD techniques, PECVD techniques, nitridation techniques, combinations comprising at least one of the foregoing techniques, and the like, on the gate 64 to form one or more gate stack structures. The resulting gate stack structures are then etched, and one or more silicon nitride spacers 62 are formed on both sidewalls of the gate stack structures using LPCVD techniques, PECVD techniques, nitridation techniques, combinations comprising at least one of the foregoing techniques, and the like, as illustrated in FIG. 10.

Once the gate stack structures are formed and aligned on the silicon substrate surface, the substrate can be further processed to form devices and local interconnect such as forming bitlines, interlevel dielectrics, additional wiring levels, and the like.

In an alternative embodiment, after the sacrificial support oxidation and support implants are formed, the silicon nitride layer 52 is etched by RIE to form a spacer 56 in the array. During the support gate oxidation, the array vertical gate polysilicon 50 is oxidized (not shown) and this oxide is removed by known hydrogen fluoride based wet etch methods before polysilicon 58 or gate conductor 64 is deposited. In yet another embodiment, the silicon nitride spacer 56 is formed before the silicon nitride layer 52 is deposited.

Figure 12:
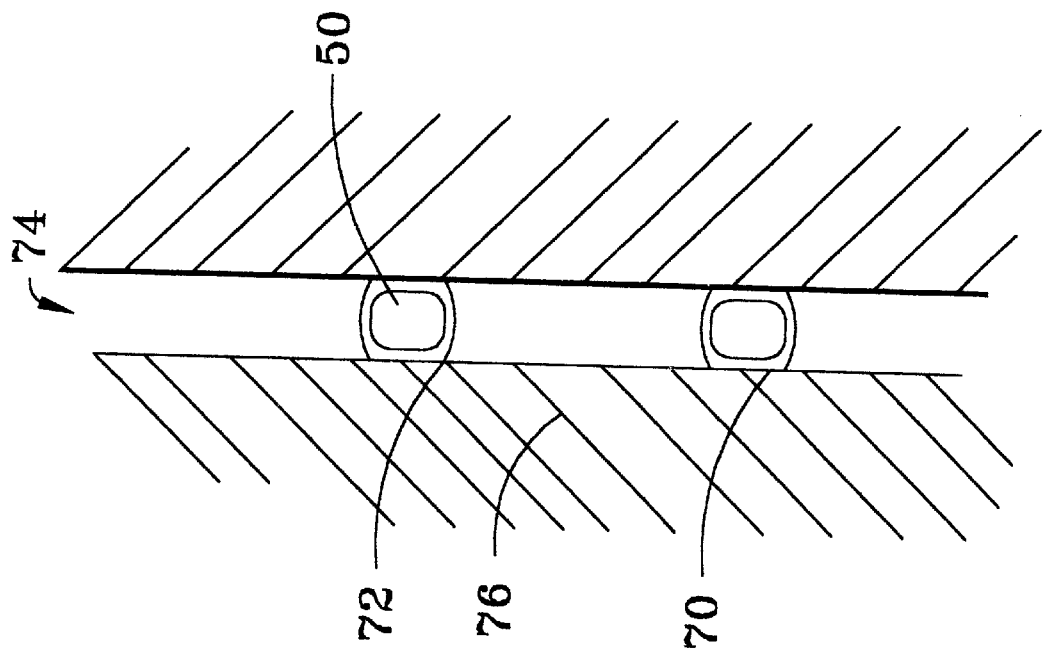
FIG. 12 illustrates a top view of a vertical MOSFET structure manufactured according to the process steps of FIGS. 3–10.
Figure 11:
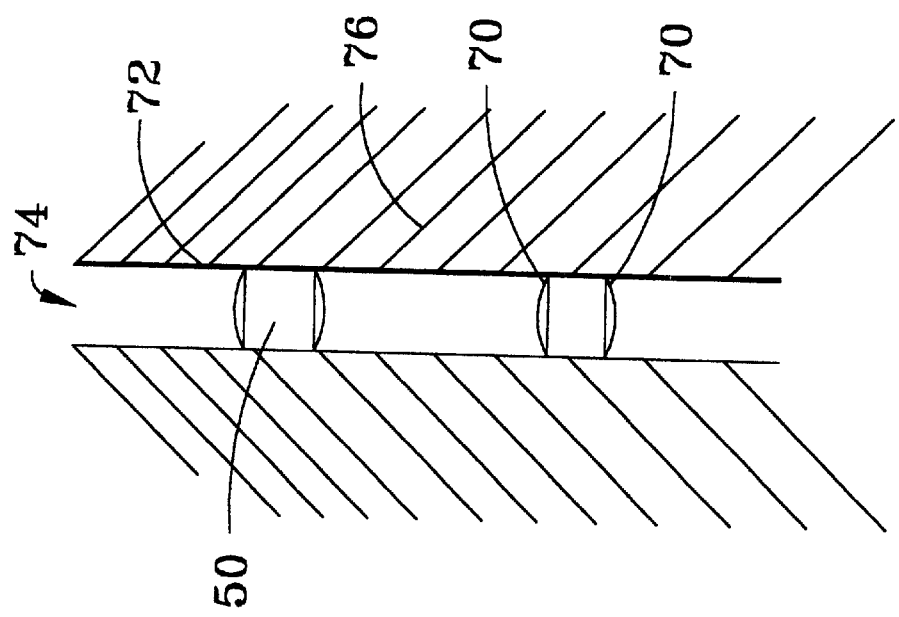
FIG. 11 illustrates a top view of a vertical MOSFET structure of the prior art.

It is to be noted that top view of the structure presented in this invention illustrated in FIG. 12 is different from the prior art shown in FIG. 11. As can be seen in FIG. 11, the inner spacers 70 are only formed between the deep trench 72 and active area 74. However, in the present invention the inner spacers 70 are formed after shallow trench isolation (STI), thus the spacers 70 are formed along the entire surface of the exposed trench 72, and along the edge of the STI oxide region 76 as shown in FIG. 12.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

We claim:

1. A vertical MOSFET structure used in forming dynamic random access memory, comprising:

a gate stack structure comprising one or more silicon nitride spacers;

a vertical gate polysilicon region disposed in an array trench, wherein said vertical gate polysilicon region further includes one or more silicon nitride spacers disposed within said array trench and atop said vertical gate polysilicon region;

a bitline diffusion region;

a shallow trench isolation region bordering said array trench; and wherein said gate stack structure is disposed on said vertical gate polysilicon region such that said silicon nitride spacers of said gate stack structure and said vertical gate polysilicon region form a borderless contact with said bitline diffusion region and said shallow trench isolation region.

2. The vertical MOSFET structure of claim 1, further comprising an oxide collar formed on a sidewall of said vertical gate polysilicon region.

3. The vertical MOSFET structure of claim 1, wherein said silicon nitride spacers are formed on a sidewall of said gate stack structure.

4. The vertical MOSFET structure of claim 1, wherein said silicon nitride spacers are formed on a sidewall of said vertical gate polysilicon region and between said bitline diffusion region and said vertical gate polysilicon region.

5. The vertical MOSFET structure of claim 1, wherein said borderless contact further comprises said silicon nitride spacers of said gate stack structure and said silicon nitride spacers of said vertical gate polysilicon region are vertically aligned.

6. A vertical MOSFET structure used in forming dynamic random access memory, comprising:

a gate stack structure comprising one or more silicon nitride spacers disposed on a sidewall of said gate stack structure;

a vertical gate polysilicon region disposed in an array trench, comprising one or more silicon nitride spacers disposed within said array trench and atop said vertical gate polysilicon region, and opposite a bitline diffusion region and a shallow trench isolation region; and wherein said gate stack structure is disposed on said vertical gate polysilicon region such that said silicon nitride spacers of said gate stack structure and said vertical gate polysilicon region are in contact and vertically align to form a borderless contact between said gate stack structure and said bitline diffusion region, and between said gate stack structure and said bitline diffusion region.

* * * * *